United States Patent
Afzali-Ardakani et al.

(10) Patent No.: US 8,809,153 B2
(45) Date of Patent: Aug. 19, 2014

(54) GRAPHENE TRANSISTORS WITH SELF-ALIGNED GATES

(75) Inventors: Ali Afzali-Ardakani, Ossining, NY (US); Phaedon Avouris, Yorktown Heights, NY (US); Damon B. Farmer, White Plains, NY (US); Yu-Ming Lin, West Harrison, NY (US); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/468,092

(22) Filed: May 10, 2012

(65) Prior Publication Data
US 2013/0302963 A1    Nov. 14, 2013

(51) Int. Cl.
*H01L 21/336* (2006.01)
*H01L 29/16* (2006.01)

(52) U.S. Cl.
CPC ......... *H01L 29/1606* (2013.01); *Y10S 977/734* (2013.01)
USPC .............................. 438/299; 257/29; 977/734

(58) Field of Classification Search
CPC .................................................. H01L 29/1606
USPC ........... 438/182, 299; 257/330; 977/720, 730, 977/755
See application file for complete search history.

(56) References Cited

U.S. PATENT DOCUMENTS

| | | | |
|---|---|---|---|
| 7,732,859 B2 | 6/2010 | Anderson et al. | |
| 2004/0155259 A1* | 8/2004 | Taniguchi et al. | 257/192 |
| 2008/0111157 A1* | 5/2008 | Dang et al. | 257/194 |
| 2010/0221896 A1 | 9/2010 | Sandoval | |
| 2011/0068323 A1 | 3/2011 | Chen et al. | |
| 2011/0114919 A1 | 5/2011 | Jenkins et al. | |
| 2011/0260136 A1 | 10/2011 | Lee et al. | |
| 2011/0284818 A1 | 11/2011 | Avouris et al. | |
| 2012/0056161 A1 | 3/2012 | Avouris et al. | |
| 2012/0132885 A1* | 5/2012 | Lippert et al. | 257/9 |

OTHER PUBLICATIONS

Badmaev, A., et al. "Self-Aligned Fabrication of Graphene RF Transistors With T-Shaped Gate" ACS Nano. Mar. 2012. (6 Pages).
Craciun, M., et al. "Tuneable Electronic Properties in Graphene" Nano Today, vol. 6, Issue 1, Feb. 2011. pp. 1-28.
Farmer, D., et al. "Graphene Field-Effect Transistors With Self-Aligned Gates" Applied Physics Letters, 97. Jul. 2010. (3 Pages).
Liao, L., et al. "High-Speed Graphene Transistors With a Self-Aligned Nanowire Gate" Nature. Sep. 2010. pp. 1-4.
Liao, L., et al. "Sub-100 Nm Channel Length Graphene Transistors" Nano Letters, vol. 10. Oct. 2010. pp. 1-11.

(Continued)

*Primary Examiner* — Thao X Le
*Assistant Examiner* — Laura Dykes
(74) *Attorney, Agent, or Firm* — Tutunjian & Bitetto, P.C.; Vazken Alexanian (57) ABSTRACT

Graphene transistor devices and methods of their fabrication are disclosed. In accordance with one method, a resist is deposited to pattern a gate structure area over a graphene channel on a substrate. In addition, gate dielectric material and gate electrode material are deposited over the graphene channel and the resist. Further, the resist and the electrode and dielectric materials that are disposed above the resist are lifted-off to form a gate structure including a gate electrode and a gate dielectric spacer and to expose portions of the graphene channel that are adjacent to the gate structure. Additionally, source and drain electrodes are formed over the exposed portions of the graphene channel.

20 Claims, 7 Drawing Sheets

(56) References Cited

OTHER PUBLICATIONS

Meric, I., et al. "Current Saturation in Zero-Bandgap, Top-Gated Graphene Field Effect Transistors" Nature Nanotechnology, vol. 3. Sep. 2008. pp. 654-659.

Wang, Y., et al. "High Performance Graphene Fets With Self-Aligned Buried Gates Fabricated on Scalable Patterned Ni-Catalyzed Graphene" 2011 Symposium on VLSI Technology Digest of Technical Papers. Jun. 2011. pp. 116-117.

Office Action issued Jul. 17, 2013 for U.S. Appl. No. 13/492,097, filed Jun. 8, 2012.

* cited by examiner

GRAPHENE TRANSISTORS WITH SELF-ALIGNED GATES

GOVERNMENT RIGHTS

This invention was made with Government support under Contract No.: FA8650-08-C-7838 awarded by the Defense Advanced Research Projects Agency (DARPA). The Government has certain rights in this invention.

BACKGROUND

1. Technical Field

The present invention relates to graphene transistors, and more particularly to systems, apparatuses and devices incorporating graphene transistors with self-aligned gates, and methods of their fabrication.

2. Description of the Related Art

Graphene is a material that has been studied for both scientific and technological applications due to its unique electronic properties. Specifically, the high mobility of charge carriers in graphene combined with the ability to modulate its carrier concentration by an external electric field renders graphene-based field-effect transistors (GFETs) promising candidates for high frequency applications. For example, graphene (field-effect transistors) FETs have been demonstrated to operate at cut-off frequencies as high as 300 GHz. Additional increases in $f_T$ may be achieved through further development of the constituent device materials and the device design.

For conventional silicon-based FETs, an important design concern is resistance in access regions between the gate and source/drain of the devices. The access resistance is reduced by doping the ungated access regions through ion implantation to create a self-aligned structure. Specifically, an insulating sidewall (spacer) surrounding the gate stack is created, followed by the formation of highly-doped source/drain regions by ion implantation and thermal activation.

SUMMARY

One embodiment is directed to a method for fabricating a graphene transistor device. In accordance with the method, a resist is deposited to pattern a gate structure area over a graphene channel on a substrate. In addition, gate dielectric material and gate electrode material are deposited over the graphene channel and the resist. Further, the resist and the electrode and dielectric materials that are disposed above the resist are lifted-off to form a gate structure including a gate electrode and a gate dielectric spacer and to expose portions of the graphene channel that are adjacent to the gate structure. Additionally, source and drain electrodes are formed over the exposed portions of the graphene channel.

Another embodiment is also directed to a method for fabricating a graphene transistor device. In accordance with the method, a resist is deposited to pattern a gate structure area over a graphene channel on a substrate. In addition, gate electrode material and gate dielectric material are deposited over the graphene channel and the resist. Further, the resist and the electrode and dielectric materials that are disposed above the resist are lifted off to form a gate structure including a gate electrode and a gate dielectric spacer and to expose portions of the graphene channel that are adjacent to the gate structure. Additionally, source and drain electrodes are formed over the exposed portions of the graphene channel such that an interface between at least one of the source and drain electrodes and the graphene channel maintains a consistent degree of contact throughout the interface.

An additional embodiment is directed to a method for fabricating a graphene transistor device. In the method, a resist is deposited to pattern a gate structure area over a graphene channel on a substrate. In addition, gate electrode material and gate dielectric material are deposited over the graphene channel and the resist. Further, the resist and the electrode and dielectric materials that are disposed above the resist are lifted-off to form a gate structure including a gate electrode and a gate dielectric spacer and to expose portions of the graphene channel that are adjacent to the gate structure. Additionally, source and drain electrodes are formed over the exposed portions of the graphene channel such that an interface between the source/drain electrode(s) and the graphene channel maintains a consistent degree of electrical conductivity between the graphene channel and the source/drain electrode(s) throughout the interface.

An alternative exemplary embodiment is directed to a graphene transistor device. The device includes source and drain electrodes and a gate structure including a dielectric sidewall spacer that is disposed between the source and drain electrodes. The device may further include a graphene layer that is adjacent to at least one of the source and drain electrodes, where an interface between the source/drain electrode(s) and the graphene layer maintains a consistent degree of contact throughout the interface.

An additional embodiment is directed to a graphene transistor system including source and drain electrodes and a gate structure including a dielectric sidewall spacer that is disposed between the source and drain electrodes. The system further includes a graphene layer that is adjacent to at least one of the source and drain electrodes. Here, an interface between the source/drain electrode(s) and the graphene layer maintains a consistent degree of electrical conductivity between the graphene layer and source/drain electrode(s) throughout the interface.

Further, another embodiment is directed to a graphene transistor device including source and drain electrodes and a gate structure including a dielectric sidewall spacer that is disposed between the source and drain electrodes. The device further includes a graphene layer that is adjacent to the source and drain electrodes, where an interface between the source and drain electrodes and the graphene layer maintains a consistent degree of contact and a consistent degree of electrical conductivity between the graphene layer and the source and drain electrodes throughout the interface.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Exemplary embodiments of the present principles are directed to graphene FETs. Although graphene FETs have the potential for widespread application, one factor that can limit the ultimate performance of graphene FETs is the presence of parasitic series resistance between the source/drain contacts and the gated graphene channel of the FETs. While these access regions serve to reduce the parasitic capacitance between the gate and the source/drain electrodes, their resistance results in a lower current that hinders the device performance. It is therefore desirable to minimize the access resistance as much as possible. Minimizing the access resistance is especially important in the downscaling of graphene devices because the access resistance can become comparable to the gated channel resistance and, as a result, can adversely affect the device behavior. As noted above, in conventional silicon-based FETs, the access resistance is reduced by doping access regions using ion implantation and thermal activation. However, the use of this ion-implantation doping technique in the two-dimensional structure of graphene of GFETs would inevitably damage the fragile carbon lattice. Therefore, the most desirable transistor configuration is a self-aligned device where the gate and the source/drain electrodes align to each other without overlap and with minimum gaps.

To create self-aligned GFETs, a variety of techniques can be employed. In one technique, the gate stack is formed by using the gate electrode as an etch mask and etching the globally deposited gate dielectric with a liquid chemical. A spacer is then formed around the gate stack by leveraging the inertness of the graphene surface to atomic layer deposition (ALD), and uniformly coating the stack with insulating ALD material while leaving the source/drain regions of the graphene electrically accessible. The problem with this technique is that the ALD spacer step coats isolated regions of the source/drain graphene, causing the contact resistance to increase due to inconsistent contact between the graphene and the source/drain electrodes. Furthermore, the liquid chemical etch employed to form the gate stack column results in lateral etching of the dielectric. This undercutting, which has been found to be significant, constrains the minimum attainable length (scaling) of the gated channel. It also creates regions underneath the gate electrode that have different doping and electrostatic properties (e.g., dielectric permittivity), which can hinder device operation.

In another technique, nanowires are used as both a mask for self-alignment and as the gate electrode. Placement and assembly of these nanowires rely on the process of dielectrophoresis. Once assembled, the curvature of the nanowires acts as a shadow mask for self-aligned electrode deposition. A problem with this technique is that it does not use conventional lithography processing to fabricate the devices, and will therefore suffer from integration issues. Scalability in terms of spacing between individual nanowire gates will also be hindered with the dielectrophoresis placement technique. The finite resistance of the nanowire gates and their associated contacts may also limit the ultimate device performance.

Unlike these techniques, the embodiments of the present principles described herein need not employ chemical etching, and therefore avoids undercutting of the gate dielectric mentioned above. The source/drain regions of the graphene are also left completely exposed, permitting for good electrical contact to be made. In addition, because embodiments may also utilize lift-off lithographic processing techniques to fabricate the gate electrode, the resulting devices formed in accordance with the present principles are immediately scalable and can be integrated with relative ease. The lift-off procedure described herein that can be performed to construct the gate stack with dielectric spacers permits the formation of an interface between a graphene layer and source and/or drain electrodes that has a consistent degree of contact and electrical conductivity. Specifically, the surface of the graphene layer does not have a patchy coating, which would result in increased resistance due to a lower degree of contact with overlying conductive material for the source/drain electrodes.

In the particular embodiments described herein, a practical scheme is employed to fabricate self-aligned, top-gated graphene FET devices. In the proposed structure, the gate electrode is aligned with the source/drain electrodes without resorting to any lithographic alignment procedures. In accordance with one embodiment, the top gate stack, including a dielectric insulator and a conducting electrode, is formed on the graphene surface by lift-off processing techniques. The source/drain electrodes are then formed by line-of-sight metal deposition, where they are automatically aligned to the gate, but electrically isolated from the gate by dielectric sidewall spacers of the stack.

The approaches described herein offer several advantages for fabricating graphene transistors. For example, parasitic resistances and capacitances are minimized by the self-aligned gating. This feature enhances the performance of the device for high-speed or high-frequency electronics. In addition, the schemes employed need not rely on any lithographic alignment processes, such as ion implantation, to achieve the alignment of source/drain and gate electrodes. For example, as noted above, ion implantation doping is typically used in conventional self-alignment procedures. However, this will cause damage to the graphene lattice, resulting in degraded performance of the graphene device. Additionally, chemically doped graphene regions have a lower carrier density, and hence higher resistance, than metals. Thus, source and drain metal electrodes formed in accordance with exemplary embodiments of the present principles have a relatively high carrier density.

Further, reactive ion etching (RIE) techniques are typically used to fabricate spacers between source/drain and gate electrodes. Like ion implantation, RIE can damage the graphene lattice and degrade the resulting device performance. The approaches described herein need not employ RIE processing, as the spacers can be formed using lift-off procedures. According to one exemplary aspect, high-k ALD oxide may be used as the gate dielectric, which permits for a scalable graphene device design. Moreover, by avoiding undercutting associated with wet chemical etching, the electrostatic homogeneity of the dielectric is preserved and accidental lift-off of the gate by undercutting is also avoided, allowing for small gate lengths to be attained. In addition, because the gate stack is formed by lift-off lithographic processing techniques, embodiments described herein need not rely on tedious nanowire placement strategies, thereby rendering scaling and integration relatively simple.

As will be appreciated by one skilled in the art, aspects of the present invention may be embodied as a system, device, apparatus and method. Aspects of the present invention are described below with reference to flowchart illustrations and/or block diagrams of methods, apparatus (systems) and devices according to embodiments of the invention. The flowchart and block diagrams in the Figures illustrate the architecture, functionality, and operation of possible implementations of systems, methods and devices according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of a given illustrative architecture having a substrate; however, other architectures, structures, substrate materials and process features and steps may be varied within the scope of the present invention.

It will also be understood that when an element described as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of lithographic masks, which typically include multiple copies of the chip design in question that are to be formed on a wafer. The lithographic masks are utilized to define areas of the wafer (and/or the layers thereon) to be etched or otherwise processed. In addition, the lithographic masks can, for example, be photolithographic masks or electron beam lithographic masks, depending on the lithography method employed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
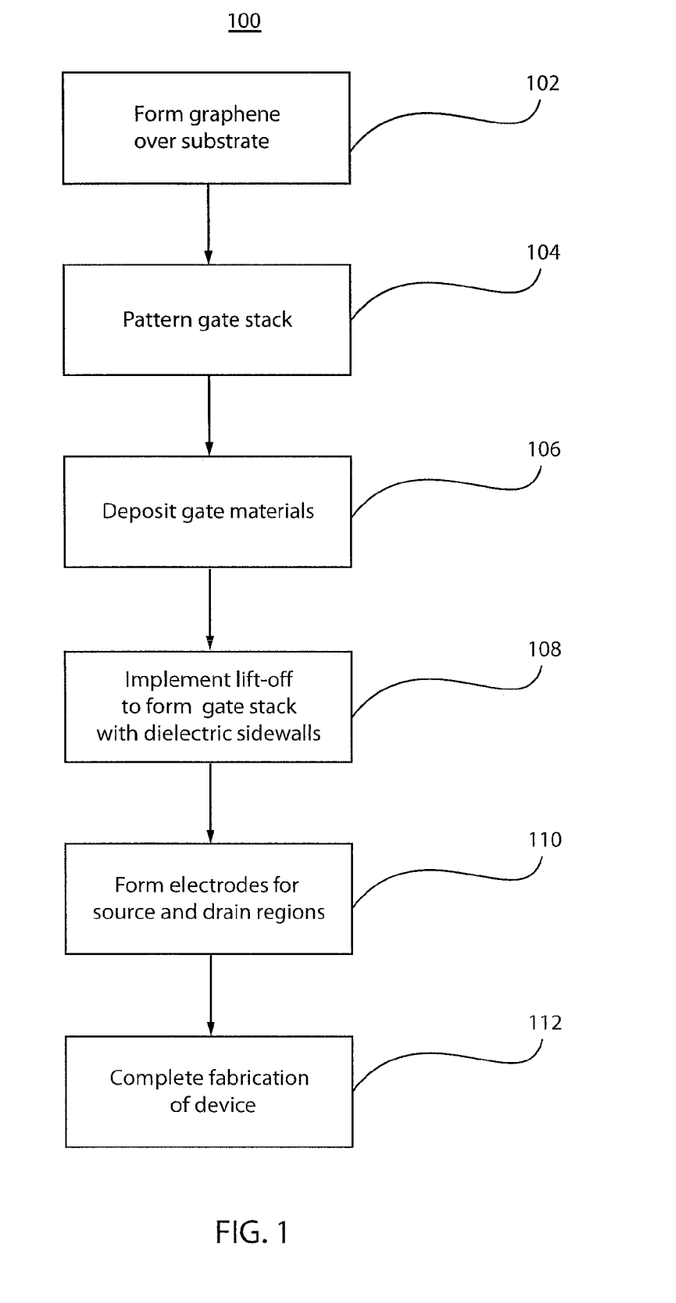
FIG. 1 is a block/flow diagram of a method for fabricating a graphene field-effect transistor (GFET) device in accordance with an exemplary embodiment.
Figure 2A:
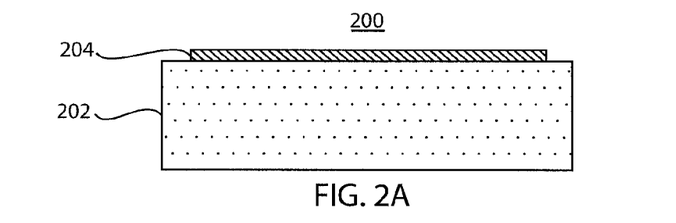
FIG. 2A is a cross-sectional view of a GFET device structure during fabrication illustrating the deposition of a graphene layer on a substrate in accordance with an exemplary embodiment.
Figure 2B:
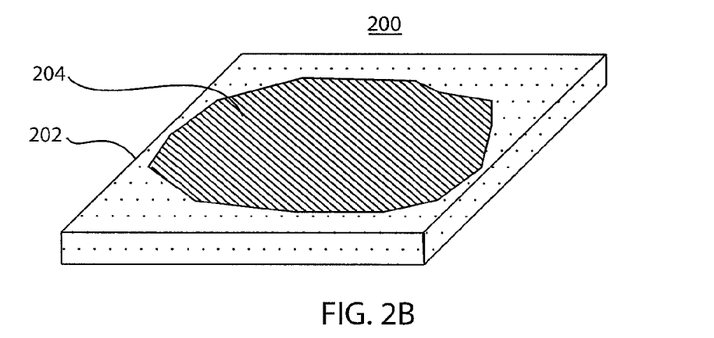
FIG. 2B is an alternative view of the structure of FIG. 2A.
Figure 3A:
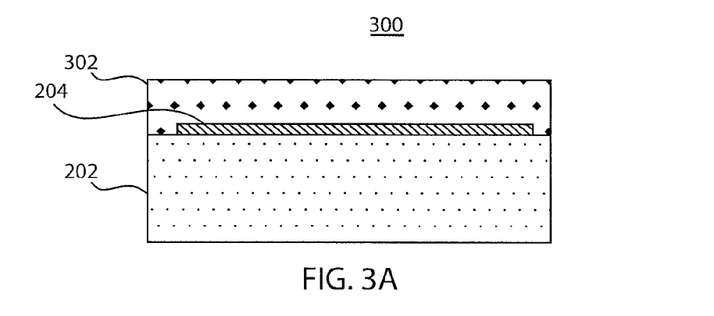
FIG. 3A is a cross-sectional view of a GFET device structure during fabrication illustrating the deposition of a resist mask to pattern a graphene channel in accordance with an exemplary embodiment.
Figure 3B:
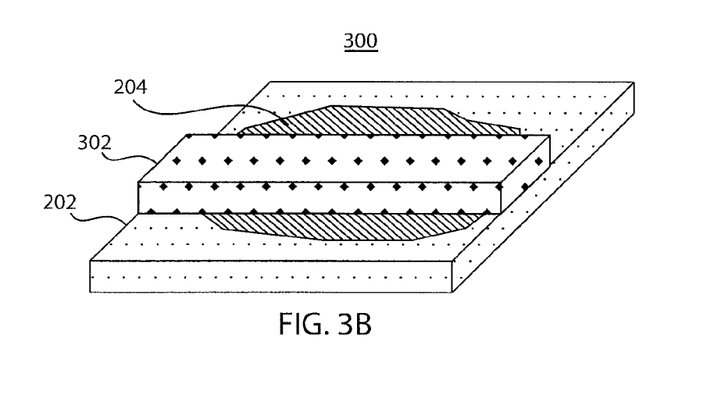
FIG. 3B is an alternative view of the structure of FIG. 3A.
Figure 4A:
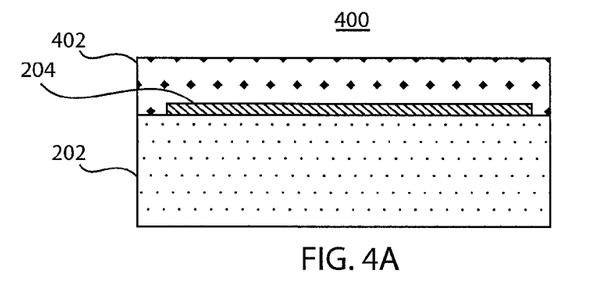
FIG. 4A is a cross-sectional view of a GFET device structure during fabrication illustrating the deposition of a resist mask to pattern a graphene channel in accordance with an alternative exemplary embodiment.
Figure 4B:
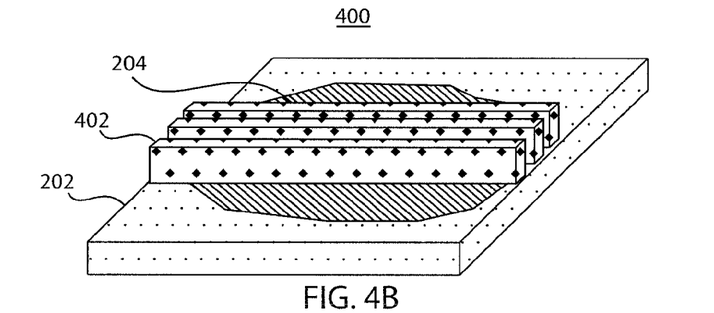
FIG. 4B is an alternative view of the structure of FIG. 4A.

Referring now to the drawings in which like numerals represent the same or similar elements and initially to FIG. 1, a method 100 for fabricating a GFET in accordance with an exemplary embodiment is depicted. To better illustrate the implementation of the method 100, reference is also made to FIGS. 2A-13B, illustrating different processing stages of GFET device structures in accordance with various embodiments. The method 100 may begin at step 102, at which a graphene layer can be formed over a substrate. For example, as illustrated in structure 200 in FIGS. 2A-2B, a graphene layer 204 can be deposited over a substrate 202, which can be composed of an insulator material or SiC. The graphene can be formed by implementing mechanical exfoliation, chemical vapor deposition (CVD) transfer, or can be epitaxially grown on an insulating substrate. In addition, as illustrated in structure 300 of FIGS. 3A and 3B, lithography techniques can be used to pattern the graphene channel and thereby define the dimensions of the graphene channel. For example, the desired channel region of the graphene can be masked with a resist 302, which can be composed of Poly(methyl methacrylate) (PMMA), that has the areal dimensions of the desired channel. A preferred range of dimensions is a gate length of 10-500 nm and a gate width of 500-20000 nm. Referring now to structure 400 of FIGS. 4A and 4B, as an alternative to using the resist 302, to improve adhesion, anchor sites, between resist structures 402, can be formed in the graphene channel pattern. Anchors are areas in which the graphene is etched to expose the supporting substrate surface. The resist 402 can be also be composed of PMMA and can be patterned into the graphene channel in accordance with lithography techniques. For example, PMMA A4 can be spun onto the graphene-containing substrate surface at 3,000 rpm and then baked at 175° C. for 5 minutes to evaporate the resist solvent. Electron-beam lithography can then be used to pattern the channel, where the regions outside the channel area are exposed to electrons, leaving a protective PMMA mask over the channel area once the pattern is developed in a 1:3 water:isopropanol solution at 5° C. for 90 s. Oxygen plasma reactive ion etching can then be preformed at a pressure of 30 mTorr, a power of 50 W, an oxygen flow rate of 200 sccm, and an etch time of 40 s to etch away the graphene outside the channel region. The PMMA mask can then be removed in acetone, exposing the graphene channel. Subsequent deposition of gate stack material, described in more detail herein below, will adhere more strongly to the anchors than to the inert graphene surface, enhancing the adhesion of the gate stack to the channel region. Because the gate stack is formed by lift-off processing in this embodiment, good adhesion of the stack to the graphene and supporting substrate is important.

Figure 5A:
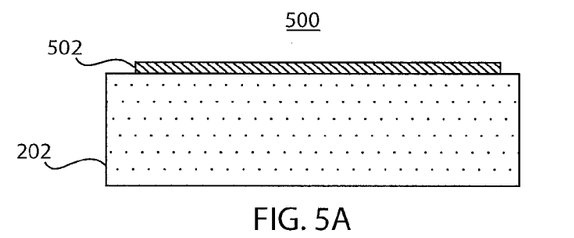
FIG. 5A is a cross-sectional view of a GFET device structure during fabrication illustrating etching of a graphene layer to form a graphene channel in accordance with an exemplary embodiment.
Figure 5B:
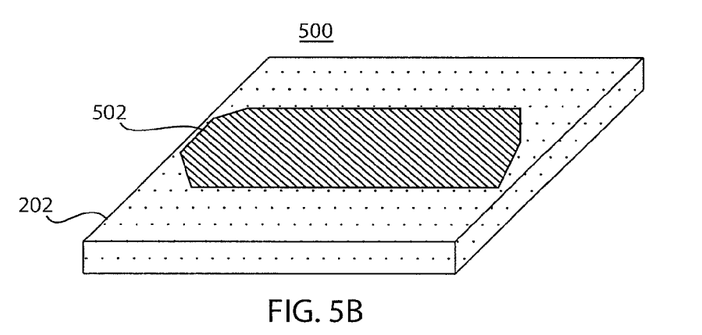
FIG. 5B is an alternative view of the structure of FIG. 5A.
Figure 6A:
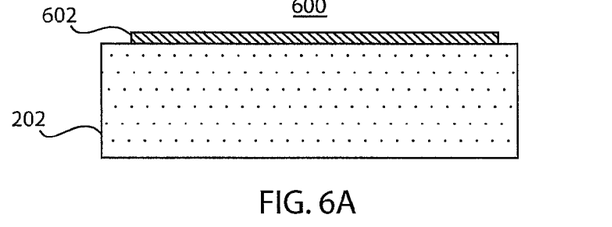
FIG. 6A is a cross-sectional view of a GFET device structure during fabrication illustrating etching of a graphene layer to form a graphene channel in accordance with an alternative exemplary embodiment.
Figure 6B:
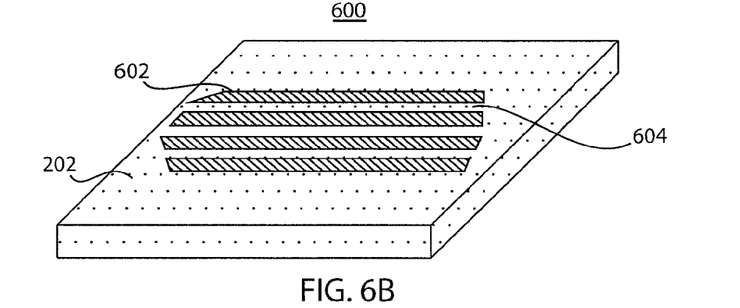
FIG. 6B is an alternative view of the structure of FIG. 6A.

To complete the formation of the graphene channel, as described above, oxygen ($O_2$) plasma can be employed to etch the exposed graphene regions of the layer 204 and the resist 302 can then be dissolved, thereby forming the graphene channel 502, illustrated in structure 500 of FIGS. 5A and 5B. Similarly, as illustrated by structure 600 of FIGS. 6A and 6B, the exposed graphene regions of structure 400 can be etched with $O_2$ plasma and the resist 402 can be dissolved to form strips 602 of the graphene channel and anchor sites 604 therebetween.

Figure 7A:
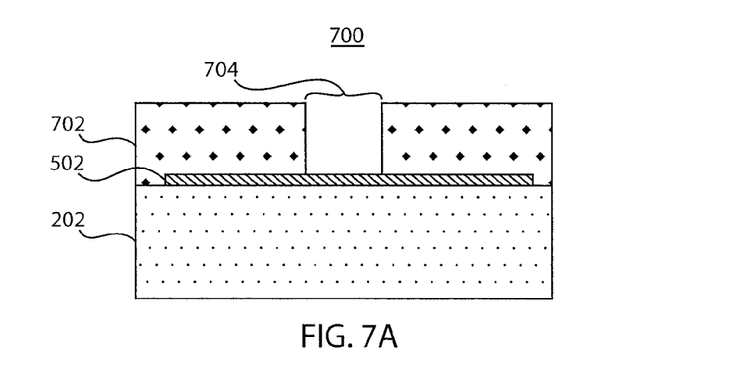
FIG. 7A is a cross-sectional view of a GFET device structure during fabrication illustrating the deposition of a resist mask to pattern a gate stack in accordance with an exemplary embodiment.
Figure 7B:
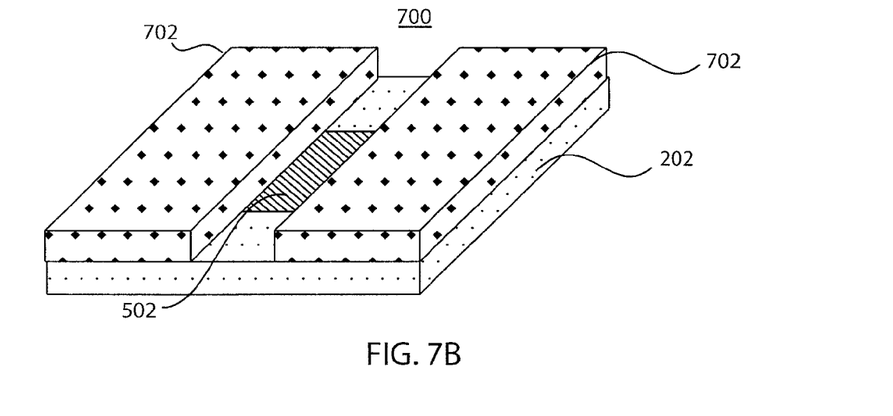
FIG. 7B is an alternative view of the structure of FIG. 7A.

At step 104, the gate structure area or stack area can be patterned on structure 500 or structure 600. For example, as illustrated by structure 700 of FIGS. 7A and 7B, lithography techniques can be employed to form resists 702 and thereby pattern the gate stack over the graphene channel 502. The resists 702 are formed such that the width 704 of the space between the resists 702 is the desired width of the gate stack to be formed. The preferred gate stack width range is 10-500 nm. It should be noted that, for purposes of brevity, step 104 and the remaining steps of the method 100 are described with respect to the structure 500. However, the steps can be applied in the same manner to the structure 600.

Figure 8A:
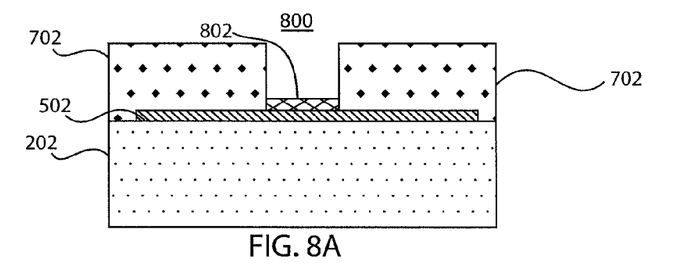
FIG. 8A is a cross-sectional view of a GFET device structure during fabrication illustrating the deposition of a seed layer for a gate structure in accordance with an exemplary embodiment.
Figure 8B:
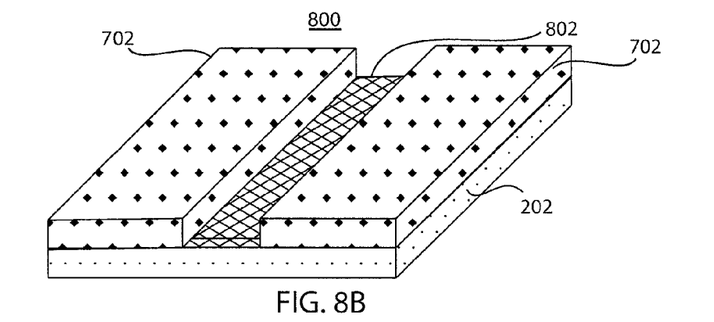
FIG. 8B is an alternative view of the structure of FIG. 8A.
Figure 9A:
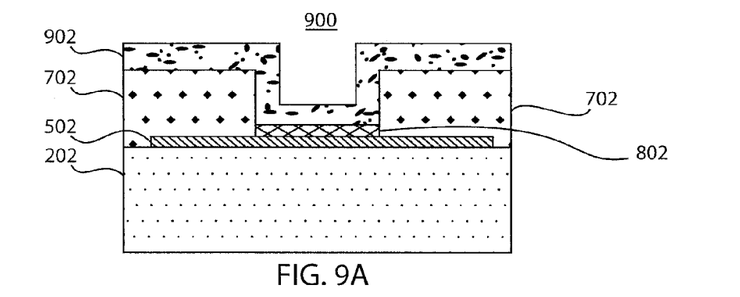
FIG. 9A is a cross-sectional view of a GFET device structure during fabrication illustrating the deposition of a dielectric spacer material for a gate stack in accordance with an exemplary embodiment.
Figure 9B:
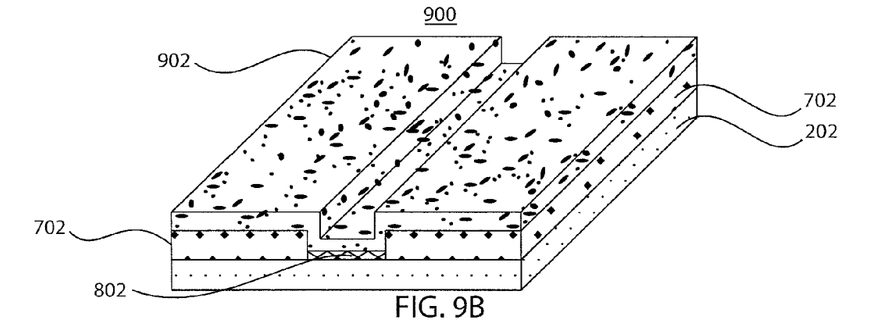
FIG. 9B is an alternative view of the structure of FIG. 9A.
Figure 10A:
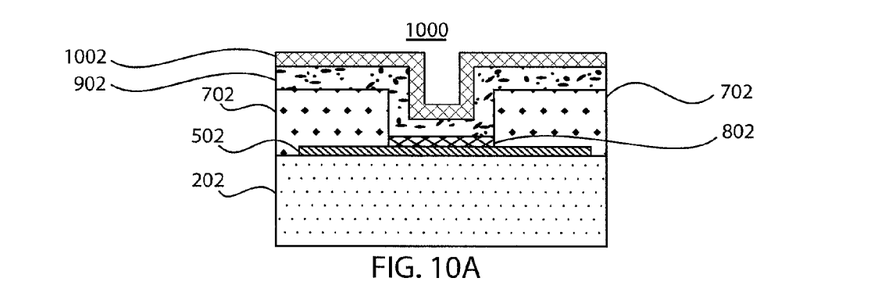
FIG. 10A is a cross-sectional view of a GFET device structure during fabrication illustrating the deposition of a gate electrode in accordance with an exemplary embodiment.
Figure 10B:
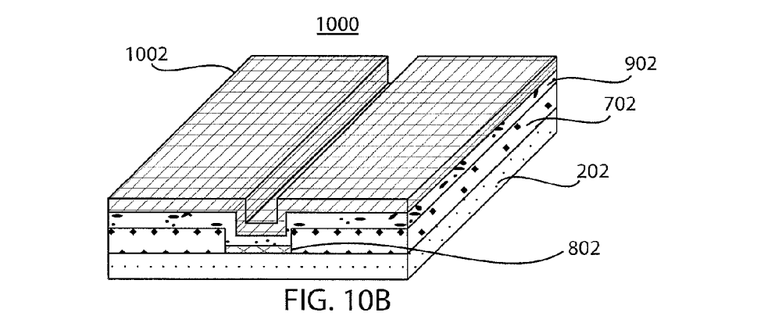
FIG. 10B is an alternative view of the structure of FIG. 10A.

At step 106, gate materials can be deposited to form a gate structure. For example, the graphene substrate can optionally be functionalized in order to promote the uniform deposition of dielectric material in subsequent processes. For example, to enhance dielectric nucleation, as illustrated by structure 800 of FIGS. 8A and 8B, a seed layer 802 can be formed on the graphene surface between the resists 702. The seed layer can be composed of, for example, an oxidized metal, a polymer, or a diazonium salt, among other materials. Specifically, the seed layer 802 can be formed by deposition and oxidation of a thin metal film, coating the graphene material with a polymer, or exposing the graphene material to a chemical compound, such as diazonium salt. The preferred range of thickness for the seed is one monolayer in the case of molecular seeding, 1-2 nm in the case of oxidized metal seeding, and 5-10 nm in the case of polymer seeding. With the optional seed layer 802 intact, as illustrated by structure 900 of FIGS. 9A and 9B, dielectric material can be globally deposited over the entire sample surface of the structure 800, including over the entire graphene channel 502 and the entire resist 702, using a conformal deposition technique, such as atomic layer deposition or chemical vapor deposition, to form gate dielectric 902. The gate dielectric 902 can be composed of, for example, $Al_2O_3$, $HfO_2$, among other materials. The preferred range of thickness for the dielectric layer is 1-10 nm. The seed 802 and dielectric 902 layers should be composed of materials and should be formed such that they do not significantly degrade the electronic properties of the graphene that is being coated. Subsequent to deposition of the dielectric layer 902, gate electrode material 1002 can be globally deposited on the entire surface of the structure 900, as shown in the structure 1000 of FIGS. 10A and 10B. In particular, the gate electrode material is deposited over the entire graphene channel 502 and the entire resist 702. The gate electrode can be composed of a metal, such as copper, or of any suitable conductive material. The preferred range of thickness for the gate electrode layer is 20-100 nm.

Figure 11A:
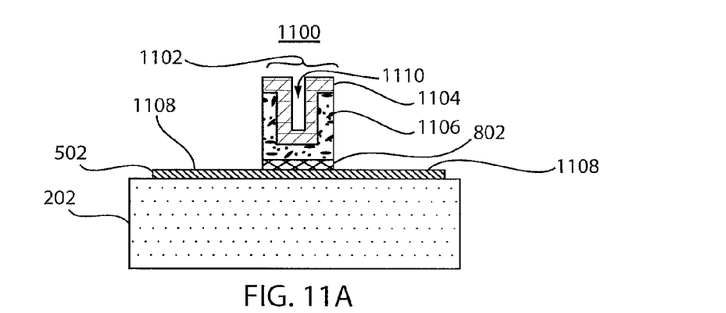
FIG. 11A is a cross-sectional view of a GFET device structure during fabrication illustrating the implementation of a lift-off procedure to form a gate structure in accordance with an exemplary embodiment.
Figure 11B:
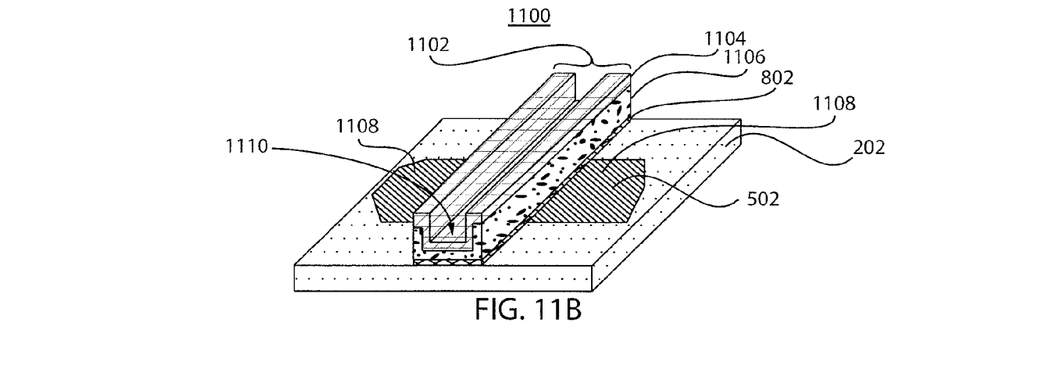
FIG. 11B is an alternative view of the structure of FIG. 11A.

At step 108, lift-off processing can be implemented to form a gate stack with dielectric sidewalls. For example, as shown in the structure 1100 of FIGS. 11A and 11B, lift-off processing can be employed to dissolve the resist 702 and remove all material overlaying the resist 702. In one exemplary process, the sample is submerged in an acetone bath at 60° C. for one hour to dissolve the resist. The loose metal is then rinsed away with agitation from a stream of acetone while still in the acetone bath and/or brief sonication while still in the acetone bath. The sample is then cleaned in flowing isopropanol and blow-dried in nitrogen. The lift-off processing results in a gate stack 1102 with dielectric sidewalls 1106, in addition to gate electrode 1104 and seed layer 802. Furthermore, electrically accessible regions 1108 of graphene that are adjacent to the gate structure 1102 are exposed for the formation of source/drain regions. As illustrated in FIGS. 11A and 11B, the gate electrode 1104 includes a recessed portion 1110 and is also electrically accessible at its top surface. Similarly, the dielectric sidewall spacer 1106 includes a u-shaped cross-section. Importantly, it is noted that the self-aligned sidewall spacer 1106 is formed prior to the formation of source and drain electrodes, thereby minimizing the risk of forming a short between the gate and the self-aligned source and drain.

Figure 12A:
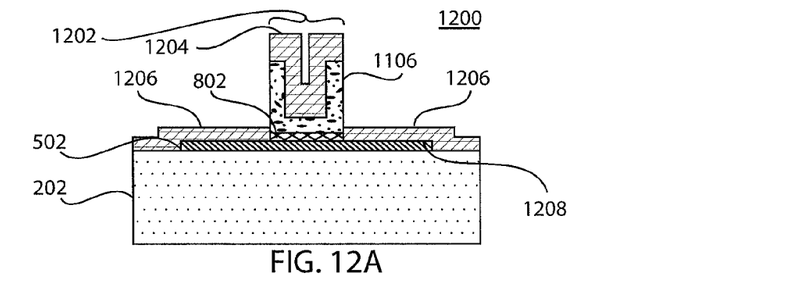
FIG. 12A is a cross-sectional view of a GFET device structure during fabrication illustrating the deposition of source and drain electrodes in accordance with an exemplary embodiment.
Figure 12B:
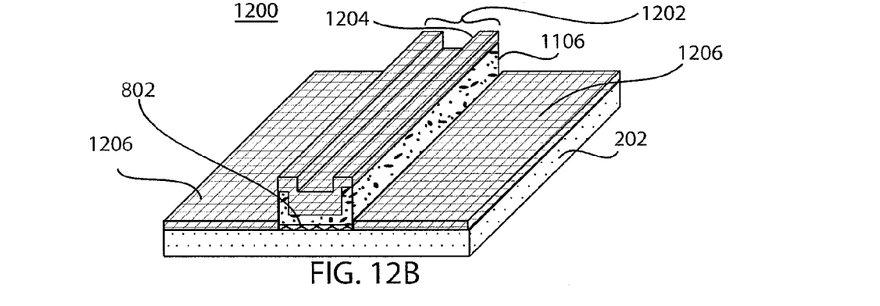
FIG. 12B is an alternative view of the structure of FIG. 12A.

At step 110, source and drain electrodes can be formed over the exposed regions 1108 of the graphene channel 502. For example, as illustrated in structure 1200 of FIGS. 12A and 12B, using the gate stack 1102 as a mask, a line-of-sight deposition technique, such as electron-beam deposition, is implemented to deposit the self-aligned source/drain electrode conductive material 1206, which can be composed of a metal, such as copper, or of any suitable conductive material. In particular, the entire surface of source and drain can be coated with metal or a suitable conductive material. As shown in FIGS. 12A and 12B, the conductive material of the source and drain electrodes entirely overlay the exposed portions 1108 of the graphene channel that are adjacent to the gate structure. In addition, the deposition of the conductive material can result in an expanded and thicker gate electrode 1204 in the gate structure 1202, as shown in FIGS. 12A and 12B. The gate electrode 1204 maintains a recessed portion. The source/drain electrodes 1206 make electrical contact with the exposed graphene regions along interface 1208. This constitutes the self-aligned part of the fabrication process. These electrodes are aligned with the gate stack such that no overlap exists between them and they are separated by minimal access regions. The thickness of these self-aligned source/drain electrodes should be thin enough to avoid electrical contact with the gate electrode, so that shorting of the electrodes does not occur. The dielectric spacers 1106 may help to prevent shorting of the electrodes. The preferred range of source/drain thickness is 5-20 nm. Optionally, as illustrated in structure 1300 of FIGS. 13A and 13B, the source/drain electrodes can be reinforced with thicker contact pads 1301 to form source 1302 and drain 1304 regions by standard lithographic techniques. The contact pads 1301 facilitate better contact and probings. The final device is a self-aligned, top-gated GFET where the gate 1202 is separated from the source and drain contact pads by a gap 1303, which is smaller than the alignment resolution that can be achieved by any state-of-the-art lithography process on graphene. The typical range of the gap is 5-20 nm. Further, the formation of the source and drain electrodes and regions leaves a top of the gate structure exposed and electrically accessible.

Figure 13A:
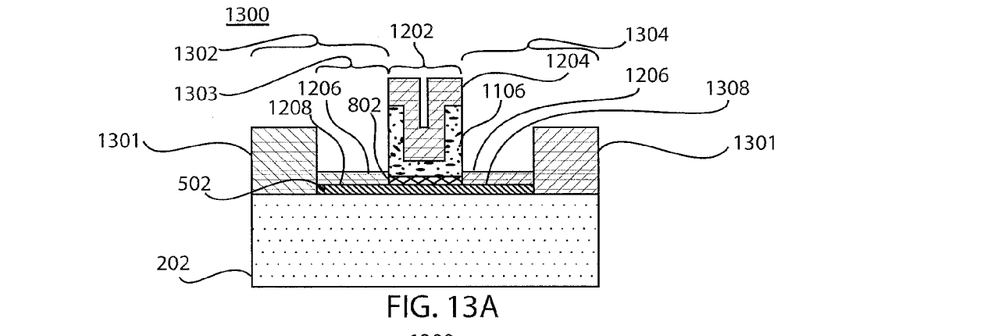
FIG. 13A is a cross-sectional view of a GFET device structure during fabrication illustrating the deposition of contact pads for the source/gate electrodes in accordance with an exemplary embodiment.
Figure 13B:
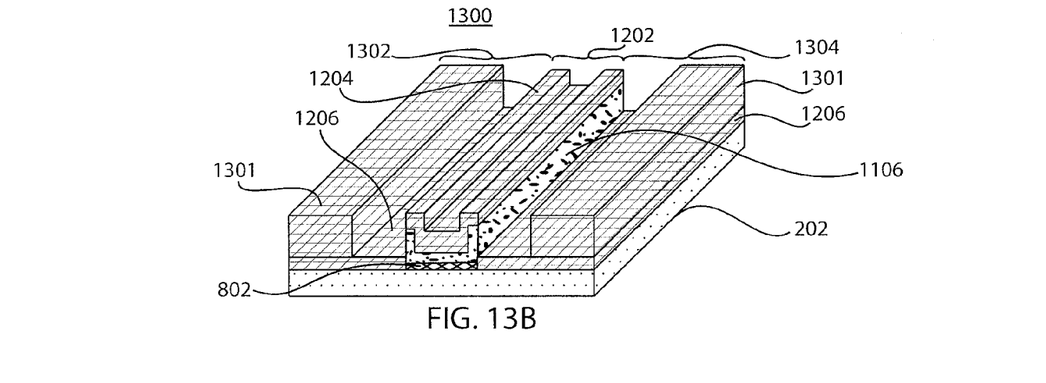
FIG. 13B is an alternative view of the structure of FIG. 13A.

As illustrated in FIGS. 13A and 13B, the graphene layer 502 is disposed beneath the gate structure 1202 and the source and drain electrodes 1206/1301. A top surface 1308 of the graphene layer that is disposed laterally from the gate structure is entirely coated with material forming the source and drain electrodes. Further, the top surface of the graphene layer 502, which includes the interface 1208, is in contact with the gate structure 1202 and the source and drain electrodes 1206. Here, the interface 1208 maintains a consistent degree of contact throughout the interface as well as a consistent degree of electrical conductivity between the graphene layer 502 and the source and drain electrodes 1206 throughout the interface. This aspect is in sharp contrast with the technique described above in which an ALD spacer step is employed, where the contact resistance is increased due to inconsistent contact between the graphene and the source/drain electrodes.

At step 112, the fabrication of the GFET device can be completed. For example, the GFET device can be implemented in a circuit by forming appropriate contacts to integrate the device into the circuit.

Having described preferred embodiments of graphene transistors with self-aligned gates, and methods of their fabrication, (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a graphene transistor device comprising:
 removing at least one portion of a graphene channel on a substrate to form at least one anchor site within the graphene channel, wherein said at least one anchor site is formed of at least one exposed portion of the substrate;
 depositing a resist to pattern a gate structure area over the graphene channel on the substrate;
 depositing gate dielectric material and gate electrode material over the graphene channel, including said at least one anchor site, and the resist;
 lifting-off the resist and the electrode and dielectric materials that are disposed above the resist to form a gate structure including a gate electrode and a gate dielectric spacer and to expose portions of the graphene channel that are adjacent to the gate structure; and
 forming source and drain electrodes over the exposed portions of the graphene channel.

2. The method of claim 1, wherein the forming source and drain electrodes further comprises depositing conductive material, of which the source and drain electrodes are composed, over the graphene channel such that the conductive material of the source and drain electrodes entirely overlay the exposed portions of the graphene channel that are adjacent to the gate structure.

3. The method of claim 2, wherein the forming source and drain electrodes further comprises depositing the conductive material over the gate electrode and expanding the gate electrode.

4. The method of claim 1, wherein the depositing gate dielectric material and gate electrode material further comprises depositing the gate dielectric material and the gate electrode material over the graphene channel entirely.

5. The method of claim 1, further comprising:
 forming the graphene channel such that the anchor site of the exposed portion of the substrate is formed between strips of the graphene channel.

6. The method of claim 1, wherein the forming source and drain electrodes leaves a top surface of the gate electrode exposed.

7. A method for fabricating a graphene transistor device comprising:
 removing at least one portion of a graphene channel on a substrate to form at least one anchor site within the graphene channel, wherein said at least one anchor site is formed of at least one exposed portion of the substrate;
 depositing a resist to pattern a gate structure area over the graphene channel on the substrate;
 depositing gate dielectric material and gate electrode material over the graphene channel, including said at least one anchor site, and the resist;
 lifting-off the resist and the electrode and dielectric materials that are disposed above the resist to form a gate structure including a gate electrode and a gate dielectric spacer and to expose portions of the graphene channel that are adjacent to the gate structure; and
 forming source and drain electrodes over the exposed portions of the graphene channel such that an interface between at least one of the source and drain electrodes and the graphene channel maintains a consistent degree of contact throughout the interface.

8. The method of claim 7, wherein the forming source and drain electrodes further comprises depositing conductive material, of which the source and drain electrodes are composed, over the graphene channel such that the conductive material of the source and drain electrodes entirely overlay the exposed portions of the graphene channel that are adjacent to the gate structure.

9. The method of claim 8, wherein the forming source and drain electrodes further comprises depositing the conductive material over the gate electrode and expanding the gate electrode.

10. The method of claim 7, wherein the depositing gate dielectric material and gate electrode material further comprises depositing the gate dielectric material over the graphene channel entirely.

11. The method of claim 7, wherein the depositing the gate electrode material and the gate dielectric material further comprises depositing the gate electrode material over the graphene channel entirely.

12. The method of claim 7, further comprising:
forming the graphene channel such that the anchor site of the exposed portion of the substrate is formed between strips of the graphene channel.

13. The method of claim 7, wherein the forming of source and drain electrodes leaves a top surface of the gate electrode exposed.

14. A method for fabricating a graphene transistor device comprising: removing at least one portion of a graphene channel on a substrate to form at least one anchor site within the graphene channel, wherein said at least one anchor site is formed of at least one exposed portion of the substrate;
depositing a resist to pattern a gate structure area over the graphene channel on the substrate;
positing a seed layer, for a gate dielectric material, over the graphene channel;
depositing the gate dielectric material and gate electrode material on top of the seed layer and over the graphene channel including the at least one anchor site and the resist;
lifting-off the resist and the electrode and dielectric materials that are disposed above the resist to form a gate structure including a gate electrode and a gate dielectric spacer and to expose portions of the graphene channel that are adjacent to the gate structure; and
forming source and drain electrodes over the exposed portions of the graphene channel such that an interface between at least one of the source and drain electrodes and the graphene channel maintains a consistent degree of electrical conductivity between the graphene channel and the at least one of the source and drain electrodes throughout the interface.

15. The method of claim 14, wherein the forming source and drain electrodes further comprises depositing conductive material, of which the source and drain electrodes are composed, over the graphene channel such that the conductive material of the source and drain electrodes entirely overlay the exposed portions of the graphene channel that are adjacent to the gate structure.

16. The method of claim 15, wherein the forming source and drain electrodes further comprises depositing the conductive material over the gate electrode and expanding the gate electrode.

17. The method of claim 14, wherein the depositing gate dielectric material and gate electrode material further comprises depositing the gate dielectric material over the graphene channel entirely.

18. The method of claim 14, wherein the depositing the gate dielectric material and the gate electrode material further comprises depositing the gate electrode material over the graphene channel entirely.

19. The method of claim 14, further comprising:
forming the graphene channel such that the anchor site of the exposed portion of the substrate is formed between strips of the graphene channel.

20. The method of claim 14, wherein the forming of source and drain electrodes leaves a top surface of the gate electrode exposed.

* * * * *